United States Patent [19]

Foran, Jr.

[11] Patent Number: 4,779,233
[45] Date of Patent: Oct. 18, 1988

[54] CONTROL OF READ-OUT FROM A RAM

[75] Inventor: Christopher J. Foran, Jr., Johnson City, Tenn.

[73] Assignee: Texas Instruments Incorporated, Dallas, Tex.

[21] Appl. No.: 911,348

[22] Filed: Sep. 25, 1986

[51] Int. Cl.$^4$ .............................................. G11C 13/00
[52] U.S. Cl. .................................... 365/189; 365/73; 365/230
[58] Field of Search ................... 365/73, 189, 230, 78

[56] References Cited

U.S. PATENT DOCUMENTS 3,141,153 7/1964 Klein .................................. 365/230
3,772,658 11/1973 Sarlo .................................. 365/189

Primary Examiner—Terrell W. Fears
Attorney, Agent, or Firm—James P. McAndrews; John A. Haug; Melvin Sharp

[57] ABSTRACT

A circuit arrangement for controlling the read-out of stored information composed of first and second random access memories each having a plurality of addressable memory locations having a preferred order of write-in, an address input, an information input, and an information output, a first signal source connected to the information input of the second memory for writing information values into the memory locations of the second memory in the preferred write-in order, a second signal source connected to the information input of the first memory for writing into the memory locations of the first memory signals representing respective addresses of the second memory, and signal conducting device connected between the information output of the first memory and the address input of the second memory for delivering address signals to the second memory derived from values stored in successive memory locations of the first memory.

5 Claims, 1 Drawing Sheet

4,779,233

CONTROL OF READ-OUT FROM A RAM

BACKGROUND OF THE INVENTION

The present invention relates to the read-out of data or other information which is stored, at least temporarily, in a random access memory (RAM).

For many data processing applications, it frequently occurs that information is supplied to a storage medium in a first sequence, but must be read out in a different sequence.

This occurs, for example, in the operation of devices known as programmable controllers, which receive data from a RAM, which data must be periodically updated. When such an update occurs, new data is written in in a sequence dictated by an input-output addressing scheme and must then be re-organized, or re-ordered, according to the desired read-out sequence. This has been found to be a time consuming task which reduces the system performance speed below acceptable levels.

SUMMARY OF THE INVENTION

It is an object of the present invention to alter the sequence of data between write-in and read-out in a speedy manner.

Another object of the invention is to effect such re-ordering while allowing write-in of information to take place in the preferred write-in sequence inherent in a memory device.

The above and other objects are achieved, according to the invention, by a circuit arrangement for controlling the read-out of stored information, comprising, first and second random access memory means each having a plurality of addressable memory locations having a preferred order of write-in, address input means for supplying memory location address signals, information input means for supplying signals representing values to be stored in the memory locations, and information output means for reading stored values out of the memory locations; a first signal source connected to the information input means of the second memory means for writing information values into the memory locations of the second memory means in the preferred write-in order; a second signal source connected to the information input means of the first memory means for writing into the memory locations of the first memory means signals representing respective addresses of the second memory means; and signal conducting means connected between the information output means of the first memory means and the address input means of the second memory means for delivering address signals to the second memory means derived from values stored in successive memory locations of the first memory means.

BRIEF DESCRIPTION OF THE DRAWING

The sole FIGURE is a block circuit diagram of a preferred embodiment of the invention.

DESCRIPTION OF THE PREFERRED EMBODIMENTS

Figure 1:
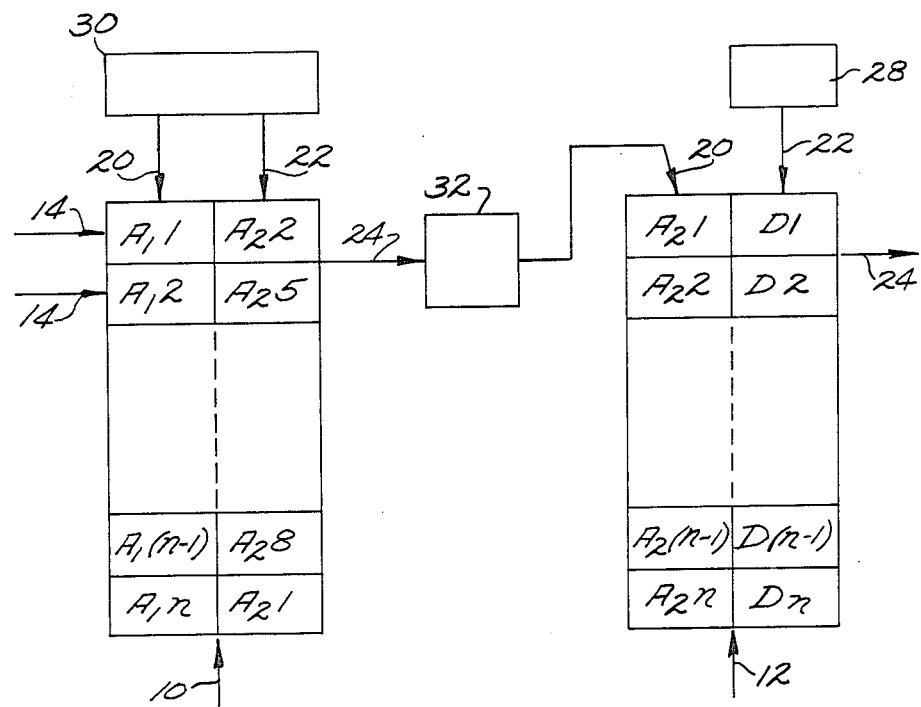

An exemplary circuit according to the invention, as shown in the FIGURE, is composed of a map RAM 10 and a data RAM 12 each having an array of individually addressable memory locations 14. Each memory location has a respective address and is capable of storing a respective data word. Each RAM is provided with: an address input 20 for receiving address signals designating the memory location being addressed for write-in or read-out; a data input 22 via which a data word is read into the addressed memory location; a data output 24 via which a data word is read out of the addressed memory location; read/write control inputs; and the usual clock inputs. The data output of RAM 12 may be connected to a data input of a process controller 30 whose operation is to be controlled by the data.

As a general rule, the system in which RAM's 10 and 12 are connected will prevent simultaneous write-in and read-out of a given RAM.

In the performance of a process, data which is generated or fed in from an external source in a certain sequence must subsequently be made available in a different sequence, the relation between the two sequences being known in advance. The present invention permits the sequence modification to be effected while enabling the memory locations of the data RAM to be addressed in order during data read-in, which is preferred.

The data is delivered from a source 28 to data input 22 of RAM 12 so that successively applied data words D are read into successive memory locations in the order of the memory location addresses $A_2$. In other words each arriving data word is stored in that location whose address is one greater than that of the location which received the preceding data words.

RAM 10, on the other hand, is connected to a signal source 30 which supplies each memory location 14 with a data signal constituting the address of a respective location of RAM 12. These data signals are read into successive memory locations of RAM 10 in the order of the memory location addresses $A_1$. Here, however, the data words are identified by the RAM 12 address locations which they identify. Thus, memory location $A_1 1$ of RAM 10 contains, as its data word, a word $A_2 2$ which represents the address of the second location of RAM 12. The data word stored in each memory location of RAM 10 can represent any desired location of RAM 10.

The data output 24 is connected to a transmission device 32 which transmits each signal appearing at the data output 24 of RAM 10 to the address input 20 of RAM 12.

The illustrated arrangement operates as follows: input to each RAM occurs at a time dictated by the nature of the operation to be performed in the system of which this arrangement forms a part. For each RAM, its write function is enabled and successive memory locations are filled with data signals which represent addresses in the case of RAM 10 and data to be further processed in the case of RAM 12. Preferably, data signals are written in to successive memory locations in order of the location addresses.

The data signals for RAM 10 come from source 30 which can be controlled by the system operating program. RAM 10 can be loaded during initial loading of the program.

The data signals for RAM 12, supplied by source 28, may be stored data values which are loaded during loading of the program or may be data values which are derived during operation of the system.

When data signals D are to be read out of RAM 12, both RAM's are set into their read mode, the words in successive memory locations of RAM 10 are supplied from the data output 24 of that RAM to the address input 20 of RAM 12, and the word in each successively addressed location of RAM 12 is read out via the associated data output 24.

During read-out, the memory locations of RAM 10 are interrogated in the order of their addresses while the order in which the memory locations of RAM 12 are interrogated is determined by the words stored in RAM 10. In the exemplary arrangement shown, the memory locations of RAM 12 would be addressed in such a way that the first data word read out is D2 and the last data word read out is D1.

Moreover, according to the invention, any location of RAM 12 can be read out more than once by simply storing the address for that word in more than one memory location of RAM 10.

Typically, sources 28 and 30 are created by appropriate conventional programming of a general purpose computer of which RAM's 10 and 12 form a part or to which they are connected. Transmission device 32 is also conventional and can be part of such computer or a separate known signal transmission device.

It will be understood that the above description of the present invention is susceptible to various modifications, changes and adaptations, and the same are intended to be comprehended within the meaning and range of equivalents of the appended claims.

What is claimed is:

1. A circuit arrangement for controlling the read-out of stored information, comprising:

first and second random access memory means each having the same plurality of addressable memory locations permitting selected order of write-in, address input means for receiving address signals designating memory locations for selective write-in and read-out, information input for supplying signals representing values to be stored in addressed memory locations, and information output means for reading stored values out of addressed memory locations;

a first signal source connected to said information input means of said second memory means for periodically writing information values into said memory locations of said second memory means in a first selected write-in order;

a second signal source connected to said information input means of said first memory means for periodically writing into said memory locations of said first memory means signals representing respective addresses of said second memory means so that the signals representing respective addresses of the second memory means are stored in the first memory means in another predetermined order which differs from the first selected order of such addresses in the second memory means; and signal conducting means connected between said information output means of said first memory means and said address input means of said second memory means to deliver address signals to said second memory means derived from values stored in successive memory locations of said first memory means in response to address signals provided to the first memory means for permitting read-out of stored values from the second memory means in said other predetermined order.

2. A circuit arrangement as defined in claim 1 wherein said memory locations of each said memory means have respective addresses represented by numerical values which follow one another in succession and the selected order of write-in corresponds to the sequence of numerical address values.

3. A circuit arrangement as defined in claim 2 wherein said second signal source is additionally connected to said address input means of said first memory means for writing signals representing a selected sequence of addresses of said second memory means into successive memory locations of said first memory means in the order of the numerical values representing the addresses of said memory locations of said first memory means.

4. A circuit arrangement as defined in claim 2 wherein said signal conducting means are operative for delivering signals derived from values stored in successive memory locations of said first memory means in the order of the numerical values representing the addresses of said memory locations of said first memory means.

5. A circuit arrangement as defined in claim 1 in combination with a process controller having a data input connected to receive the stored values read out at said information output means of said second memory means.

* * * * *